United States Patent [19]
Cory et al.

[11] Patent Number: 5,323,113
[45] Date of Patent: Jun. 21, 1994

[54] NMR PROBE WHICH INCLUDES B1, GRADIENT COILS

[75] Inventors: David G. Cory, Boston; Frank H. Laukien, Lincoln; Werner E. Maas, Billerica, all of Mass.

[73] Assignee: Bruker Instruments, Inc., Billerica, Mass.

[21] Appl. No.: 30,693

[22] Filed: Mar. 12, 1993

[51] Int. Cl.$^5$ ............................................. G01V 3/00
[52] U.S. Cl. .................................... 324/318; 324/307
[58] Field of Search ............... 324/300, 307, 309, 310, 324/311, 312, 313, 314, 318, 319, 322; 128/653.2, 653.5

[56] References Cited

U.S. PATENT DOCUMENTS

| | | | |
|---|---|---|---|
| 4,165,479 | 8/1979 | Mansfield | 324/313 |
| 4,549,137 | 10/1985 | Suzuki et al. | 324/309 |
| 4,568,880 | 2/1986 | Sugimoto | 324/309 |
| 4,899,109 | 2/1990 | Tropp et al. | 324/320 |
| 4,978,920 | 12/1990 | Mansfield et al. | 324/318 |
| 5,015,954 | 5/1991 | Dechene et al. | 324/307 |
| 5,049,819 | 9/1991 | Dechene et al. | 324/307 |
| 5,168,224 | 12/1992 | Maruizumi et al. | 324/300 |

OTHER PUBLICATIONS

Three-Dimensional NMR Microscopic Imaging of Solids, Botto et al., p. 192, *Abstracts 32nd Experimental Nuclear Magnetic Resonance Spectroscopy Conference,* Apr. 7-11, 1991.
Two Dimensions of Solid-State Imaging with One RF-Gradient Coil, Werner et al., p. 192, *Abstracts 32nd Experimental Nuclear Magnetic Resonance Spectroscopy Conf.,* Apr. 7-11, 1991.
Advances in Multiple-Pulse Radiofrequency Gradient Imaging of Solids, Werner et al., p. 258, *Abstracts 33rd Experimental Nuclear Magnetic Resonance Conference,* Mar. 29, 1992-Apr. 2, 1992.
Proton MR Two-Component Chemical Shift Imaging of Fluids in Porous Media, Chang et al., p. 258, *Abstracts 33rd Experimental Nuclear Magnetic Resonance Conf.,* Mar. 29, 1992-Apr. 2, 1992.
Spatial Localization Using a "Straddle Coil", Friedrich et al. *Journal of Magnetic Resonance 77,* pp. 101-118 (1988).
The Selection of Coherence-Transfer Pathways by Inhomogeneous Z Pulses, Counsell et al., *Journal of Magnetic Resonance 64,* 470-478 (1985).
Self-Diffusion Measurements Using a Radiofrequency Field Gradient, Diter et al., *Journal of Magnetic Resonance 81,* pp. 1-12, (1989) (no month).
Improving Magnetic Field Gradient Coils for NMR Imaging, Suits et al., *J. Phys E. Sci. Instrum. 22,* pp. 565-573, (1989).

*Primary Examiner*—Michael J. Tokar
*Attorney, Agent, or Firm*—Cesari and McKenna

[57] ABSTRACT

An NMR probe is designed to generate both a homogeneous RF field over the sample volume and, alternatively, a "radial" field comprising two orthogonal gradient fields generated simultaneously in the transverse plane or a linear gradient field. The homogeneous field is generated by means of a known homogeneous coil construction, such as a Helmholtz coil or modified Helmholtz coil. The radial field can be generated by means of an inverted Helmholtz coil, either modified or unmodified, and the linear field can be generated by a Golay type coil, which coils are positioned coaxially with the homogeneous coil. The two coils are connected in parallel to the RF signal generator and switching can be accomplished either by means of an active switch or by detuning one of the coil resonant circuits when the other coil is in use.

16 Claims, 5 Drawing Sheets

NMR PROBE WHICH INCLUDES B1, GRADIENT COILS

FIELD OF THE INVENTION

This invention relates to nuclear magnetic resonance (NMR) spectroscopy and NMR imaging and, in particular, to NMR spectrometer probes which include means for producing $B_1$ magnetic field gradients.

BACKGROUND OF THE INVENTION

All atomic nuclei with an odd atomic mass or an odd atomic number possess a nuclear magnetic moment. Nuclear magnetic resonance (NMR) is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split into $(2I+1)$ non-degenerate energy levels, which are separated from each other by an energy difference that is directly proportional to the strength of the applied magnetic field. This splitting is called the "Zeeman" splitting and is equal to $\gamma h H_o/2\pi$, where h is Plank's constant and $H_o$ is the strength of the magnetic field. The frequency corresponding to the energy of the Zeeman splitting ($\omega_o = \gamma H_o$) is called the "Larmor frequency" and is proportional to the field strength of the magnetic field. Typical NMR active nuclei include $^1H$ (protons), $^{13}C$, $^{19}F$, and $^{31}P$. For these four nuclei $I=\frac{1}{2}$, and each nucleus has two nuclear magnetic energy levels.

When a bulk sample containing NMR active nuclei is placed within a magnetic field, the nuclear spins distribute themselves amongst the nuclear magnetic energy levels in accordance with Boltzmann's statistics. This results in a population imbalance between the energy levels and a net nuclear magnetization. It is this net nuclear magnetization that is studied by NMR techniques.

At equilibrium, the net nuclear magnetization is aligned parallel to the external magnetic field and is static. A second magnetic field perpendicular to the first and rotating at, or near, the Larmor frequency can be applied to induce a coherent motion of the net nuclear magnetization. Since, at conventional field strengths, the Larmor frequency is in the megahertz frequency range, this second field is called a "radio frequency" or RF field.

The coherent motion of the nuclear magnetization about the RF field is called a "nutation." In order to conveniently deal with this nutation, a reference frame is used which rotates about the z-axis at the Larmor frequency. In this "rotating frame" the RF field, which is rotating in the stationary "laboratory" reference frame, is static. Consequently, the effect of the RF field is to rotate the now static nuclear magnetization direction at an angle with respect to the main static field direction. By convention, an RF field pulse of sufficient length to nutate the nuclear magnetization through an angle of 90°, or $\pi/2$ radians, is called a "$\pi/2$ pulse."

A $\pi/2$ pulse applied with a frequency near the nuclear resonance frequency will rotate the spin magnetization from an original direction along the main static magnetic field direction into a plane perpendicular to the main magnetic field direction. Because the RF field and the nuclear magnetization are rotating, the component of the net magnetization that is transverse to the main magnetic field precesses about the main magnetic field at the Larmor frequency. This precession can be detected with a receiver coil that is resonant at the precession frequency and located such that the precessing magnetization induces a voltage across the coil. Frequently, the "transmitter coil" employed for applying the RF field to the sample and the "receiver coil" employed for detecting the magnetization are one and the same coil.

In addition to precessing at the Larmor frequency, in the absence of the applied RF energy, the nuclear magnetization also undergoes two relaxation processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$.

The nuclear magnetic moment experiences an external magnetic field that is reduced from the actual field due to a screening from the electron cloud. This screening results in a slight shift in the Larmor frequency (called the "chemical shift" since the size and symmetry of the shielding is dependent on the chemical composition of the sample).

Since the Larmor frequency is proportional to the field strength, it is generally desirable to insure that the main magnetic field and the RF magnetic field are spatially homogeneous, at least in the sample area, so that all parts of the sample generate an NMR signal with the same frequency. However, there are some known applications of NMR techniques for which it is desirable to establish a magnetic field gradient across the sample: examples of such applications include NMR imaging, molecular diffusion measurements, solvent suppression, coherence pathway selection and multiple-quantum filters.

A conventional method of applying such gradients is to use special gradient coils that create a $B_O$ field in addition to the coils which generate the main static field and the coils which generate the RF magnetic field. These special coils are often located in the NMR probe and generate a magnetic field gradient called a $B_O$ gradient which has at least one field component that has a direction parallel to the main static field direction, but has an amplitude which varies as a function of spatial position. All of the aforementioned NMR applications have been demonstrated utilizing a $B_O$ gradient. The coils which generate the $B_O$ gradients are well-known and not of significance with regards to the invention.

Another method of generating a magnetic field gradient is to use special RF field coils to generate a magnetic field gradient called a $B_1$ gradient which has at least one component with a direction lying in the plane perpendicular to the main static field direction and a magnitude that varies across the plane. All of the previously-mentioned applications have also utilized such a $B_1$ gradient.

There have been three different prior art approaches that used $B_1$ gradient coils in high-resolution spectroscopy. The first of these approaches was to use the inherent inhomogeneity of a standard RF coil to generate a non-homogeneous field. Consequently, this approach did not use true gradients. The approach is described in detail in an article entitled "The Selection of Coherence-transfer Pathways by Inhomogeneous z Pulses", C. J. R. Counsell, M. H. Levitt and R. R. Ernst, *Journal of Magnetic Resonance*, v. 64, pp. 470–478.

A second approach utilized a special "straddle" coil to generate the required gradient. This approach is described in detail in an article entitled "Spatial Localization Using a 'Straddle Coil'", *Journal of Magnetic Resonance*, v. 77, p. 101 (1988).

A third approach used a surface coil to generate the gradient. This approach is described in detail in an article entitled "Self-Diffusion Measurements Using a Radiofrequency Field Gradient", D. Canet, B. Diter, A. Belmajdoub, J. Brondeau, J. C. Boubel and K. Elbayed, Journal of Magnetic Resonance, v. 81, pp. 1–12 (1989).

SUMMARY OF THE INVENTION

The foregoing problems are solved and the foregoing objects are achieved in one illustrative embodiment of the invention in which an NMR probe is designed to generate both a homogeneous RF field over the sample volume and, alternatively, a "radial" field comprising two orthogonal gradient fields generated simultaneously in the transverse plane or a linear gradient field. A mechanism is provided to rapidly switch the probe between generation of the homogenous field and generation of the radial or linear fields.

In accordance with one illustrative embodiment of the probe, the homogeneous field is generated by means of a known homogeneous coil construction, such as a Helmholtz coil or modified Helmholtz coil. The radial field can be generated by means of an inverted Helmholtz coil, either modified or unmodified, and the linear field can be generated by a Golay type coil, which coils are positioned coaxially with the homogeneous coil. The two coils are connected in parallel to the RF signal generator and switching can be accomplished either by means of an active switch or by detuning on of the coil resonant circuits when the other coil is in use.

DETAILED DESCRIPTION OF THE PREFERRED EMBODIMENTS

As previously mentioned, the inventive NMR probe is designed to generate both a homogeneous RF field over the sample volume and, alternatively, a "radial" field comprising two orthogonal gradient fields generated simultaneously in the transverse plane. It is possible to switch rapidly between the two fields by means of a switching mechanism.

The radial fields are generated by using special RF coils that generate two orthogonal $B_1$ gradients. The differences between the special RF coils used to generate $B_1$ gradients and the normal homogeneous RF transmitter/receiver coils found in NMR systems can be understood by closely examining both coil types.

By definition, a homogeneous RF coil generates a uniform strength RF field over the entire sample, and, ideally, the uniform strength RF field will also have a uniform phase across the sample. An RF coil is generally designed to create an oscillating magnetic field, but as previously mentioned, a nuclear spin system interacts with a rotating magnetic field. However, the oscillating RF field may be thought of as being composed of two rotating fields, one rotating in a one direction and the other counter-rotating in the opposite direction. By convention, the rotating field is defined to be in the same direction as the Larmor rotation direction. Consequently, it is this latter field which interacts with the spin system.

Of course, there will be a phase relationship between the instantaneous rotating frame (rotating at the frequency of the RF field) and the stationary laboratory reference frame at the start of any given RF pulse. This phase relationship is ideally uniform across the sample.

Figure 1:
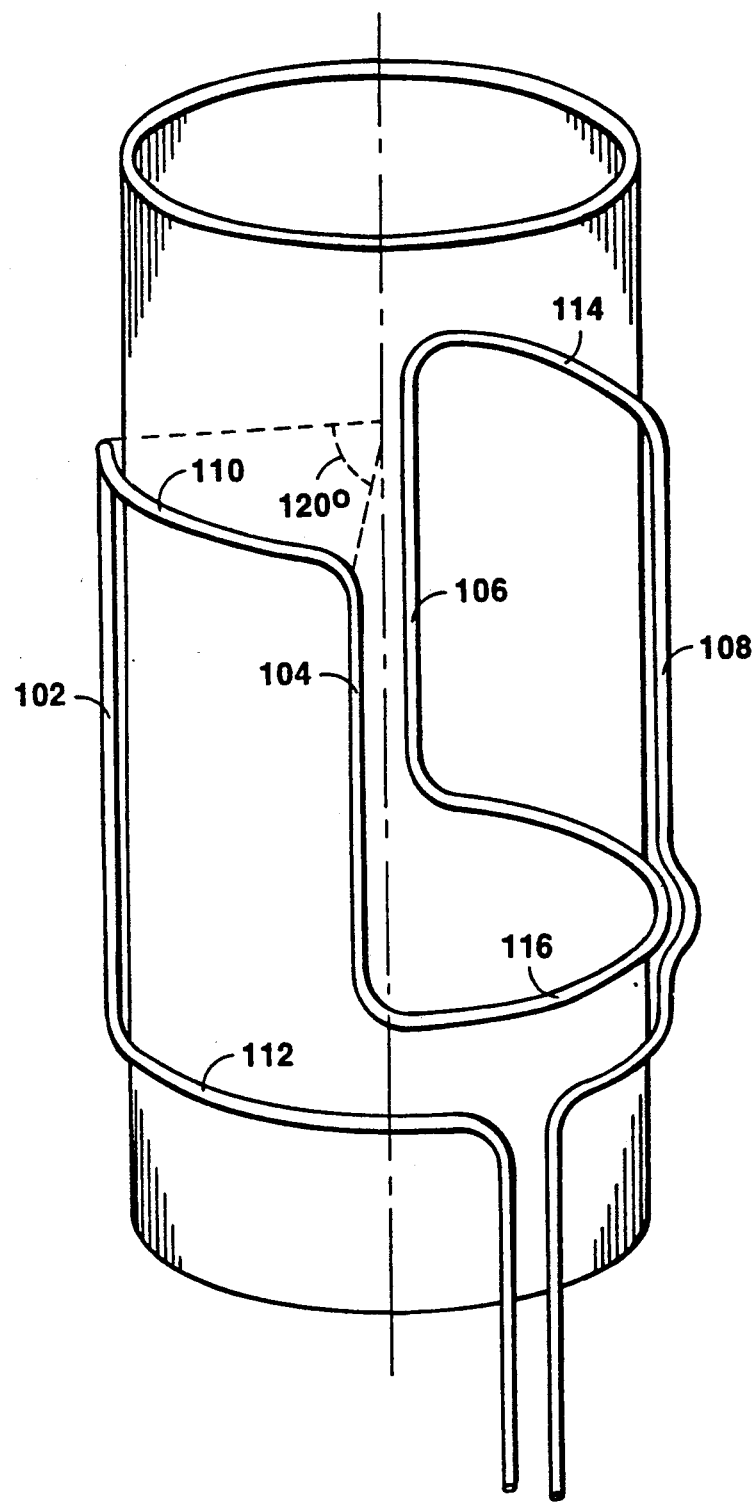
FIG. 1 is a diagram of prior art Helmholtz coil which can be used to generate a homogeneous RF magnetic field.

FIG. 1 illustrates schematically the coil windings of a prior art Helmholtz coil design which is useful for generating a homogeneous field. The illustrated windings are typically applied over a non-conductive hollow probe body in a conventional manner. The probe body has been omitted of FIG. 1 to simplify the diagram. In a typical coil arrangement, the arcuate sections (110–116) of the coil subtend an angle of approximately 120°.

Current flow is indicated by the arrows and the field is generated by the linear coil sections 102–108 and arcuate wires 110–116.

Figure 4:
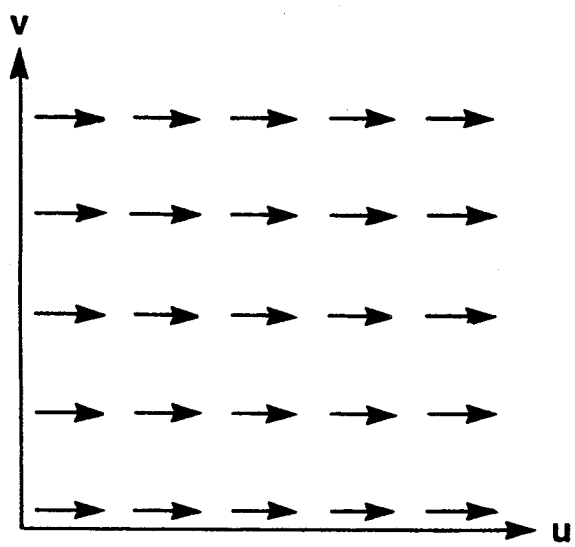
FIG. 4 is a schematic diagram of an RF field generated by a homogeneous coil.

The coil shown in FIG. 1 generates a field with a uniform field strength and a phase which is constant over the sample volume as shown in FIG. 4. FIG. 4 is a vector diagram which represents the transverse plane (the nomenclature u and v refer to the transverse plane in the rotating frame) and illustrates that the field is homogeneous within the plane. The homogeneous field is defined as having a spatial RF field profile of the form:

$$B_H(\vec{r},t) = 2B_1 \cos(\omega_{rf} t)\{ \cos(\theta)\hat{e}_x^L + \sin(\theta)\hat{e}_y^L \} \quad (1)$$

where $\hat{e}_x^L$ and $\hat{e}_y^L$ define the directions of the laboratory frame, $\theta$ is the phase of the RF field (generated in the transmitter) and it is assumed that, at an instant in time, the field is spatially uniform throughout the transverse plane. For an "x" pulse, $\theta$ is equal to zero. The corresponding rotating frame Hamiltonian is:

$$H_H(t) = -B_1\gamma\{ \cos(\omega_{rf} t + \theta)I_x + \sin(\omega_{rf} t + \theta)I_y \} \quad (2)$$

which is spatially uniform. In FIG. 4, each of the horizontal arrows represents the local field strength.

There are (at least) three interesting choices in the design of a $B_1$ gradient coil for the generation of the second RF field. For example, a coil can be designed in accordance with known design principles to generate gradients as follows:

Option 1, a probe which generates a gradient with fields of $\partial B_x/\partial x$, $-0.5\partial B_y/\partial y$, and $-0.5\partial B_z/\partial z$ Option 2, a probe which generates a gradient with fields of $\partial B_x/\partial x$, $-1.0\partial B_y/\partial y$ Option 3, a probe which generates a gradient with fields of $\partial B_x/\partial x$, $-1.0\partial B_z/\partial z$ Since the above coils are RF coils, the $B_z$ component of the RF field is not involved in the generation of the NMR spectrum, so the three above coils generate fields in the transverse plane as follows:

Option 1—two orthogonal gradients of relative strengths 1 and 0.5,

Option 2—two orthogonal gradients of relative strengths 1 and 1,

Option 3—a single gradient.

Option 1 generates two orthogonal gradients, but the gradients do not have equal strength. Therefore, this option will not be considered further.

Figures 2, 3:
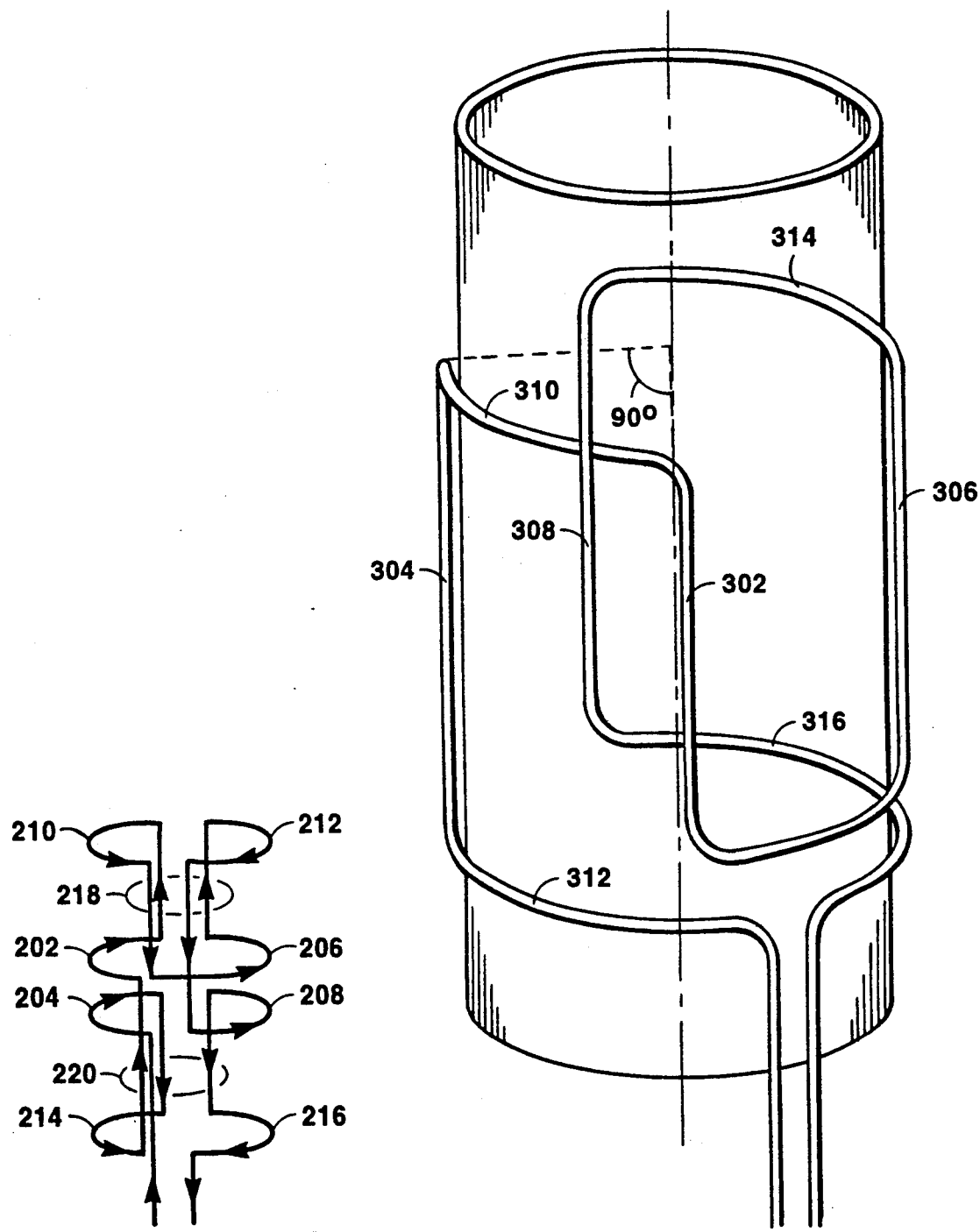
FIG. 2 is a diagram of a prior art RF Golay coil used to generate a linear magnetic field gradient.
FIG. 3 is a diagram of an "inverted" Helmholtz coil used to generate a radial magnetic field gradient and constructed in accordance with one illustrative embodiment of the invention.

Option 3 is closest to being analogous to the well-known $B_0$ gradient probe and the coil geometry for this conventional configuration is shown in FIG. 2 and called a Golay coil.

FIG. 2 illustrates schematically the coil windings of a prior art Golay coil design which is useful for generating a linear magnetic gradient field. As with the homogeneous field, the illustrated windings are typically applied over a non-conductive hollow probe body in a conventional manner. The probe body has been omitted from FIG. 2 to simplify the diagram.

Current flow is indicated by the arrows and the field is actually generated by the arcuate coil sections 202-208. The connecting wire sections 218 and 220 are arranged so that the fields generated by currents flowing the wires cancel. The coil size is designed so that the arcuate wires 210-216 are sufficiently far from the sample that the fields generated by current flowing in sections 210-216 can be neglected in the vicinity of the sample.

Figure 5:
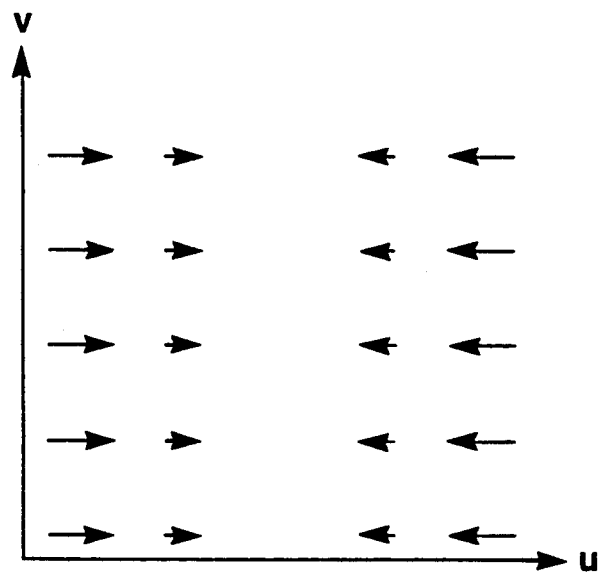
FIG. 5 is a schematic diagram of an RF field generated by a linear magnetic field gradient coil.

A vector picture of the RF field variation across a single channel RF gradient coil constructed in accordance with the Option 3 design is shown in FIG. 5.

The field generated by Option 3 uniformly increases across the sample, and the phase difference between the gradient field produced by the Option 3 coils and a homogeneous field generated by a separate homogeneous coil is uniform across the the sample. In a practical NMR system, the gradient field can be aligned with the homogeneous field via a software adjustment of the RF phase between RF pulses. The Golay coil can be combined with a homogeneous coil and a switching arrangement as described below to form the inventive coil.

In practice, the Golay coil configuration has a relatively high inductance and, as such, is less efficient than other coil configurations. An improved design utilizes the radial RF gradient of Option 2. With such a design there is higher efficiency and the probe is capable of generating two orthogonal gradient fields. An RF coil constructed in accordance with the Option 2 construction listed above generates a gradient in each of two orthogonal directions. Therefore, every RF pulse that is applied to the probe generates two orthogonal RF gradients, and the nuclear spin system responds to both gradients.

FIG. 3 illustrates schematically the coil windings of an "inverted" Helmholtz coil design constructed in accordance with the principles of the invention which is useful for generating the Option 2 radial field. As with the homogeneous coil discussed above, the illustrated windings are typically applied over a non-conductive hollow probe body in a conventional manner. The probe body has been omitted from FIG. 3 to simplify the diagram. In the new coil arrangement, the arcuate sections (310-316) of the coil subtend an angle of approximately 90°.

Current flow is indicated by the arrows and although the coil is constructed similarly to the conventional Helmholtz coil, the coil sections are connected differently so that the resulting field is different. However, the field is actually generated by the linear coil sections 302-308. The coil size is designed so that the arcuate connecting wires 310-316 are sufficiently far from the sample that the fields generated by current flowing in sections 310-316 can be neglected in the vicinity of the sample.

Figure 6:
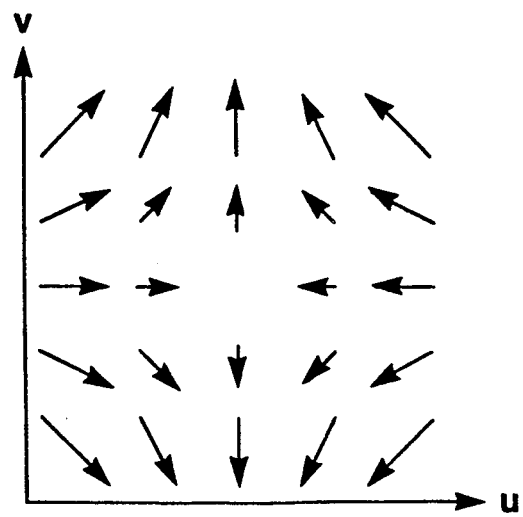
FIG. 6 is a schematic diagram of an RF field generated by a radial gradient coil.

The coil shown in FIG. 3 generates a field with both a field strength and a phase which vary over the sample volume as shown in FIG. 6. FIG. 6 is a vector diagram which represents the transverse plane (the nomenclature u and v refer to the transverse plane in the rotating frame). The radial field is defined as having a spatial RF field profile of the form:

$$B_R(\vec{r},t) = 2B_1 \cos(\omega_{rf}t)\{\cos(\Phi(\vec{r})+\theta)\hat{e}_x^L + \sin(\Phi(\vec{r})+\theta)\hat{e}_y^L\} \quad (3)$$

where $\Phi(\vec{r})$ is the phase of the RF field and $\theta$ is the transmitter phase. In FIG. 6, as in FIG. 4, each of the arrows represents the local field strength. As shown in FIG. 6, not only the strength of the RF field, but also the phase of the RF field is spatially dependent. There are a number of consequences of this spatial dependency:

1. a sample excited in the presence of such a gradient will not generate any detectable magnetization if a homogeneous coil is used as the receiver coil,
2. the phase of the gradient field varies over $2\pi$ as compared to the homogeneous coil.

The rudimentary geometries of all of the above-mentioned coils are known in connection with the construction of $B_0$ gradient coils where the design criteria are concerned only with the $H_z$ gradient field component since only the $H_z$ component of a DC field can couple into the spin system. This latter fact, of course, insures that there is always a unique axis for the gradient. However, when the RF coils are used as gradient coils, the design criteria must be concerned with the $H_x$ and $H_y$ fields since these latter RF fields couple into the spin system. The $H_z$ component of an RF field is unimportant. This fact changes the design criteria considerably. In addition, the electronic circuits required to drive the coils also differ from the electronics used to drive conventional $B_0$ coils, since $B_0$ coils are driven with a DC, or near DC, current, whereas, in the RF case, the coil must be driven with high-frequency RF energy.

The two aforementioned differences cause not only the associated electronics to be very different in the $B_0$ and RF gradient cases, but also require changes in the design and construction of the RF coils. Although the RF gradient coil is generally of the same geometry as the $B_0$ gradient coil, only a single conductor turn (or a few conductor turns) are employed and self-resonance frequencies, inductances, and inter-winding capacitances, which are not of interest in $B_0$ coil construction become important parameters. These latter parameters can, however, be dealt with using conventional and well-known coil construction techniques.

Figure 7:
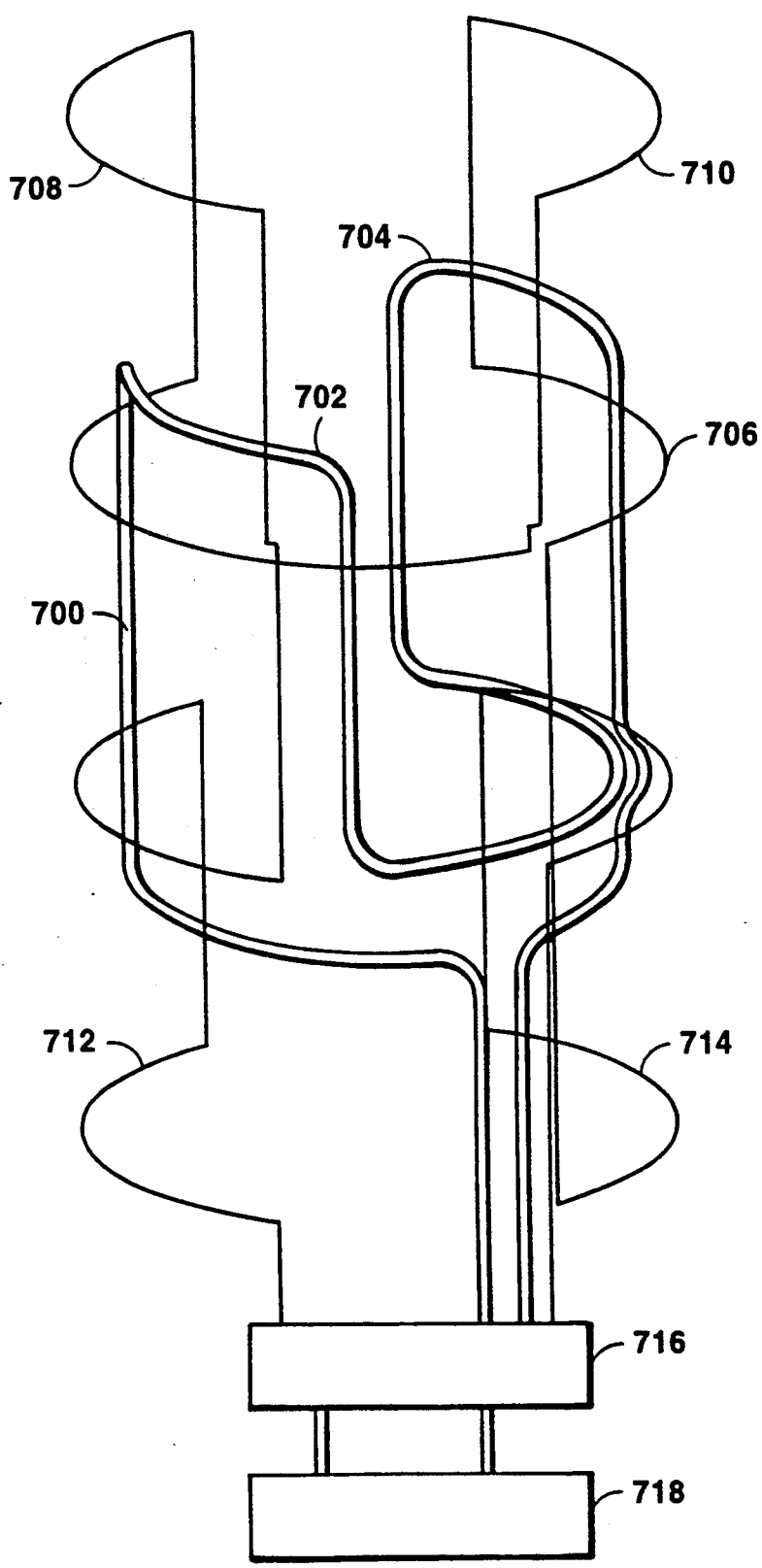
FIG. 7 is a schematic diagram of an NMR probe incorporating both a homogeneous probe, a Golay coil and a switching mechanism.

FIG. 7 schematically illustrates a dual coil probe which incorporates both the conventional homogeneous coil 700 with sections 702 and 704 and the Golay coil 706 with sections 708, 710, 712 and 714. The coils 700 and 706 are arranged coaxially so that either the homogeneous field or the linear field can be applied to the sample and both coils 700 and 706 are connected to the RF generator 716 by means of a switch 718.

The switch mechanism 718 used to connect the RF generator to the coils can be any conventional switching arrangement. For example, it is possible to use a physical switch which utilizes high-frequency PIN diodes. However, since the coils 700 and 706 are typically tuned with tuning capacitors to the required resonance frequency, the switching can be effected by simply detuning one or the other of the coils 700 and 706 so that it no longer effectively participates in the interaction.

Figure 8:
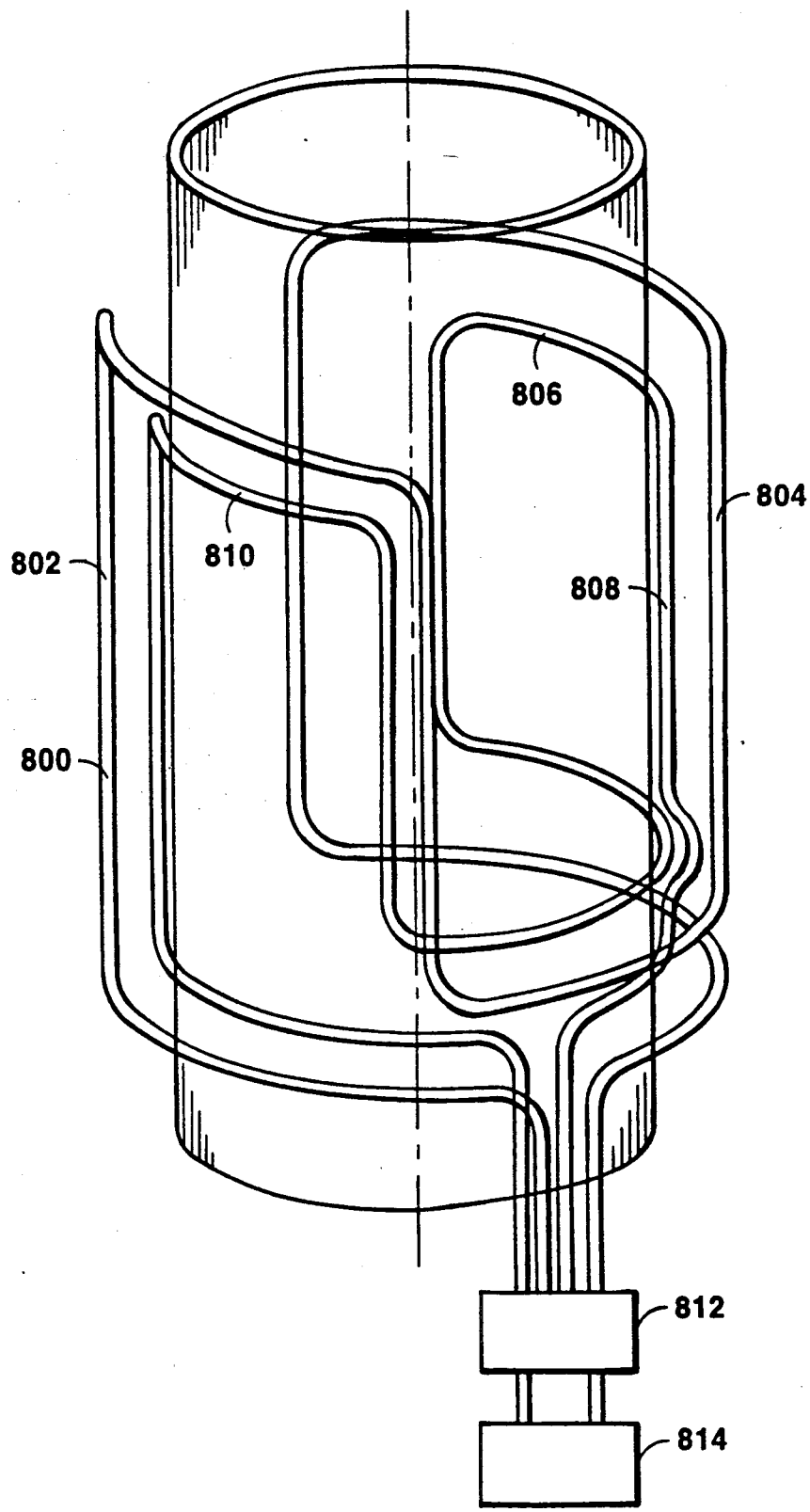
FIG. 8 is a schematic diagram of an NMR probe incorporating both a homogeneous coil, an inverted Helmholtz coil, and a switching mechanism.

FIG. 8 schematically illustrates a dual coil probe which incorporates both the conventional homogeneous coil 800 having sections 802 and 804 and the inverted Helmholtz coil 806 with sections 808 and 810. The coils 800 and 806 are arranged coaxially so that either the homogeneous field or the radial field can be applied to the sample and both coils 800 and 806 are connected to the RF generator 814 by means of a switch mechanism 812 as described above.

Although only a few illustrative embodiments of the present invention have been disclosed in the discussion above, other modifications and enhancements will be immediately obvious to those skilled in the art, which modifications and enhancements are intended to be covered by the claims set forth below. For example, although only single-turn coils are disclosed for the Helmholtz coils and the Golay coils, other known geometries exist which generate the same fields. Also coils known as "saddle coils" generate the same fields as Helmholtz coils and can be used in their place.

What is claimed is:

1. An NMR sample probe for generating $B_1$ magnetic field gradients in a sample volume from RF energy generated by an RF generator, the probe comprising:
   a first Helmholtz coil positioned around the sample volume and having magnetic field generating windings electrically connected so that a homogeneous magnetic field is generated in the sample volume when RF energy is applied to the magnetic field generating windings;
   a second Helmholtz coil positioned around the sample volume and having magnetic field generating windings electrically connected so that a radial magnetic gradient field is generated in the sample volume when RF energy is applied to the magnetic field generating windings; and
   an RF switch connected between the RF generator and the first and second Helmholtz coils to allow one of the first and second Helmholtz coils to be connected to the RF generator.

2. A NMR probe according to claim 1 wherein the first Helmholtz coil has an axis and the second Helmholtz coil has an axis and the first and second Helmholtz coils are positioned coaxially.

3. An NMR probe according to claim 1 wherein the RF switch comprises an RF PIN diode switch.

4. An NMR probe according to claim 1 wherein the NMR probe is used to conduct NMR experiments at a resonant frequency and the RF switch comprises means for tuning the first and the second Helmholtz coils to the resonant frequency and means for selectively detuning one of the first and second Helmholtz coils.

5. An NMR sample probe for generating $B_1$ magnetic field gradients in a sample volume from RF energy generated by an RF generator, the probe comprising:
   a first Helmholtz coil positioned around the sample volume and having magnetic field generating windings comprising at least four linear sections physically positioned parallel to each other and means for electrically connecting the four linear sections so that a homogeneous magnetic field is generated in the sample volume when RF energy is applied to the magnetic field generating windings;
   a second Helmholtz coil positioned around the sample volume and having magnetic field generating windings comprising at least four linear sections physically positioned parallel to each other and means for electrically connecting the four linear sections so that a radial magnetic gradient field is generated in the sample volume when RF energy is applied to the magnetic field generating windings; and
   an RF switch connected between the RF generator and the first and second Helmholtz coils to allow one of the first and second Helmholtz coils to be connected to the RF generator.

6. An NMR probe according to claim 5 wherein the first Helmholtz coil has an axis and the second Helmholtz coil has an axis and the first and second Helmholtz coils are positioned coaxially.

7. An NMR probe according to claim 6 wherein the RF switch comprises an RF PIN diode switch.

8. An NMR probe according to claim 6 wherein the NMR probe is used to conduct NMR experiments at a resonant frequency and the RF switch comprises means for tuning the first and the second Helmholtz coils to the resonant frequency and means for selectively detuning one of the first and second Helmholtz coils.

9. An NMR sample probe for generating $B_1$ magnetic field gradients in a sample volume from RF energy generated by an RF generator, the probe comprising:
   a Helmholtz coil positioned around the sample volume and having magnetic field generating windings electrically connected so that a homogeneous magnetic field is generated in the sample volume when RF energy is applied to the magnetic field generating windings;
   a Golay coil positioned around the sample volume and having magnetic field generating windings electrically connected so that a linear magnetic gradient field is generated in the sample volume when RF energy is applied to the magnetic field generating windings; and
   an RF switch connected between the RF generator and the Helmholtz coil and the Golay coil to allow one of the Helmholtz and Golay coils to be connected to the RF generator.

10. An NMR probe according to claim 9 wherein the Helmholtz coil has an axis and the Golay coil has an axis and the Helmholtz and Golay coils are positioned coaxially.

11. An NMR probe according to claim 9 wherein the RF switch comprises an RF PIN diode switch.

12. An NMR probe according to claim 9 wherein the NMR probe is used to conduct NMR experiments at a resonant frequency and the RF switch comprises means for tuning the Helmholtz coil and the Golay coil to the resonant frequency and means for selectively detuning one of the first and second Helmholtz coils.

13. An NMR sample probe for generating $B_1$ magnetic field gradients in a sample volume from RF energy generated by an RF generator, the probe comprising:

a Helmholtz coil positioned around the sample volume and having magnetic field generating windings comprising at least four linear sections physically positioned parallel to each other and means for electrically connecting the four linear sections so that a homogeneous magnetic field is generated in the sample volume when RF energy is applied to the magnetic field generating windings;

a Golay coil positioned around the sample volume and having magnetic field generating windings comprising at least four arcuate sections physically positioned in two parallel planes and means for electrically connecting the four arcuate sections so that a linear magnetic gradient field is generated in the sample volume when RF energy is applied to the magnetic field generating windings; and an RF switch connected between the RF generator and the Helmholtz coil and the Golay coil to allow one of the Helmholtz and Golay coils to be connected to the RF generator.

14. An NMR probe according to claim 13 wherein the Helmholtz coil has an axis and the Golay coil has an axis and the Helmholtz and Golay coils are positioned coaxially.

15. An NMR probe according to claim 14 wherein the RF switch comprises an RF PIN diode switch.

16. An NMR probe according to claim 14 wherein the NMR probe is used to conduct NMR experiments at a resonant frequency and the RF switch comprises means for tuning the Helmholtz and Golay coils to the resonant frequency and means for selectively detuning one of the Helmholtz and Golay coils.

* * * * *